US012745376B2

(12) United States Patent
Schmitt

(10) Patent No.: US 12,745,376 B2
(45) Date of Patent: Sep. 22, 2026

(54) TEMPERING DEVICE AND BATTERY DISCONNECT UNIT

(71) Applicant: Robert Bosch GmbH, Stuttgart (DE)

(72) Inventor: Markus Schmitt, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 232 days.

(21) Appl. No.: 18/891,063

(22) Filed: Sep. 20, 2024

(65) Prior Publication Data

US 2025/0098128 A1 Mar. 20, 2025

(30) Foreign Application Priority Data

Sep. 20, 2023 (DE) .................... 10 2023 209 170.4

(51) Int. Cl.

*H05K 7/20* (2006.01)
*B60L 58/32* (2019.01)
*H01H 50/12* (2006.01)
*H01M 10/62* (2014.01)
*H10W 40/00* (2026.01)

(52) U.S. Cl.

CPC ............ *H05K 7/2089* (2013.01); *B60L 58/32* (2019.02); *H01H 50/12* (2013.01); *H01M 10/62* (2015.04); *H10W 40/00* (2026.01)

(58) Field of Classification Search

None

See application file for complete search history.

(56) References Cited

U.S. PATENT DOCUMENTS 7,626,822 B2 * 12/2009 Ma ...................... H10W 40/611 165/185
7,667,970 B2 * 2/2010 Ma ...................... H10W 40/226 361/704
10,147,666 B1 * 12/2018 Trimberger ............. G06F 1/203
10,631,436 B1 * 4/2020 Larsen ............... H05K 7/20418
12,495,529 B2 * 12/2025 Fukuchi ................ H02M 1/007
12,557,253 B2 * 2/2026 Yu ....................... H01M 50/204
12,598,726 B2 * 4/2026 Wenk .................. H05K 5/0082
2007/0236883 A1 * 10/2007 Ruiz ..................... H10W 40/47 257/E23.098
2011/0013365 A1 * 1/2011 Oota ................... B62D 5/0406 361/707
2011/0042038 A1 * 2/2011 Herron .............. H05K 7/20927 165/104.11
2025/0167338 A1 * 5/2025 Sasakura .................. H05K 7/20
2025/0226487 A1 * 7/2025 Kim .................... H01M 10/613
2025/0364633 A1 * 11/2025 Driant ..................... B60L 50/64

* cited by examiner

*Primary Examiner* — Courtney L Smith
(74) *Attorney, Agent, or Firm* — Michael Best & Friedrich LLP

(57) ABSTRACT

A tempering device of a battery disconnect unit includes a first tempering plate, on which a switching device of the battery disconnect unit can be arranged, and a second tempering plate, on which the power electronics of the battery disconnect unit can be arranged. The first tempering plate and the second tempering plate are directly connected to one another in a material-locking fashion, forming a common flow chamber through which tempering fluid can flow. The switching device and the power electronics are arranged on a top side of the tempering device.

10 Claims, 3 Drawing Sheets

35
12
11
3,30
71,75
5
4
1
10
22
21

TEMPERING DEVICE AND BATTERY DISCONNECT UNIT

BACKGROUND

The invention is based on a tempering device. Another object of the present invention is a battery disconnect unit.

Electrical switching devices such as a relay, for example, are usually arranged between a voltage tap of a terminal battery cell of a battery module and the overall voltage tap of such a battery module and are used to switch the battery module or the battery, which comprises such a battery module, on and off.

In principle, such electrical switching devices must be actively cooled, especially as they carry the entire current of the battery module.

SUMMARY

A tempering device having the features of the disclosure offers the advantage that a thermal connection or coupling between a temperature control of a switching device and a temperature control of the power electronics can be reliably reduced or avoided. As a result, the service life of such elements may be reliably increased.

In accordance with the invention, a tempering device of a battery disconnect unit is provided for this purpose. The tempering device comprises a first tempering plate and a second tempering plate. A switching device of the battery disconnect unit can be arranged on the first tempering plate and the power electronics of the battery disconnect unit can be arranged on the second tempering plate.

In so doing, the first tempering plate and the second tempering plate are connected to each other via a material-locking connection, forming a common flow chamber through which tempering fluid can flow.

The switching device and the power electronics can be arranged on a top side of the tempering device.

It is advantageous if the first tempering plate forms a first connection area on which the switching device can be arranged and if the second tempering plate forms a second connection area on which the power electronics can be arranged. The second connection area is arranged directly adjacent to the flow chamber. This makes it possible for tempering fluid to flow directly below the power electronics for reliable cooling. This provides the advantage that a comparatively high flow of heat can be dissipated over a comparatively small area, whereby the power electronics can be reliably tempered.

According to a particularly preferred aspect of the invention, the first connection area and the second connection area are arranged offset from one another in a longitudinal direction of the tempering device. As a result, the first connection area and the second connection area can be reliably thermally decoupled.

It is expedient when the first connection area forms at least two projections. A busbar of the switching device can be arranged on each of these projections. In particular, these projections are not covered by the second tempering plate. Further, such projections are not directly adjacent to the flow chamber. Accordingly, the switching device is in contact in a thermally conductive manner only with the projections of the first tempering plate.

In particular, a thermal compensation material can be arranged between a busbar of the switching device and one of the projections.

In particular, two projections are arranged in the longitudinal direction offset from the second connection area, such that a first projection is arranged first in the longitudinal direction, then the second connection area is arranged, and finally a second projection is arranged.

Further, it is preferred when the tempering device forms a first connection configured to admit tempering fluid into the flow chamber and the tempering device forms a second connection configured to allow tempering fluid out of the flow chamber. The first connection and the second connection are arranged opposite one another in a longitudinal direction of the tempering device. In particular, a straight-line flow through the chamber can be configured as a result, which supports thermal decoupling of the first tempering plate and the second tempering plate.

Further, it is preferred when the flow chamber also comprises an internal insert. The internal insert can be formed by means of a punching and/or rolling process, for example.

Such an internal insert can serve to increase the transfer of heat between the tempering fluid and the first tempering plate and/or second tempering plate, for example due to a disruption of the flow and/or an enlargement of the heat-transfer surface.

Further, the first tempering plate and the second tempering plate can be formed by a punching and/or forming process.

Expediently, the first tempering plate and the second tempering plate are formed from a metallic material, such as in particular aluminum. In particular, the internal insert can also be formed from a metallic material, such as in particular aluminum.

At this point, it is noted that the first tempering plate and the second tempering plate are preferably connected to one other through soldering. In particular, the first tempering plate and the second tempering plate can comprise braze cladding for this purpose, by means of which the first tempering plate and the second tempering plate are connected to each other, for example by means of a brazing process. Furthermore, the first tempering plate and the second tempering plate may further be connected to the internal insert and/or to the first connection and/or the second connection through soldering.

Particularly preferably, the soldered connections described are in particular designed to be comparatively narrow between the first tempering plate and the second tempering plate, such that the flow of heat through the soldered connection is minimized. In this way, a flow of heat from the switching device to the power electronics and a flow of heat from the power electronics to the switching device can be significantly reduced so that interactions between the heat dissipation from the power electronics and the heat dissipation from the switching device can be reduced.

It is also expedient when the first tempering plate and the second tempering plate have different thicknesses. In particular, the first tempering plate has a first thickness and the second tempering plate has a second thickness. The first thickness is greater than the second thickness. This provides the advantage that the first thickness of the first tempering plate and the second thickness of the second tempering plate can be adjusted to the different thermal requirements for dissipating heat from the power electronics and the switching device. In particular, heat is dissipated from the power electronics through the second tempering plate, while heat from the switching device is dissipated along the first tempering plate.

Another object of the present invention is a battery disconnect unit with a tempering device as just described. In this case, a switching device is arranged in a thermally conductive manner on the first tempering plate and the power electronics are arranged in a thermally conductive manner on the second tempering plate.

At this point, it is noted that accordingly, for example, the heat input from heat dissipated from the switching device acts exclusively on the first tempering plate and the heat input from heat dissipated from the power electronics acts exclusively on the second tempering plate. The two such dissipations of heat can thereby be thermally decoupled, thereby minimizing or preventing interactions between the described heat inputs.

BRIEF DESCRIPTION OF THE DRAWINGS

Exemplary embodiments of the invention are shown in the drawings and explained in more detail in the subsequent description.

Shown are.

DETAILED DESCRIPTION

Figure 1:
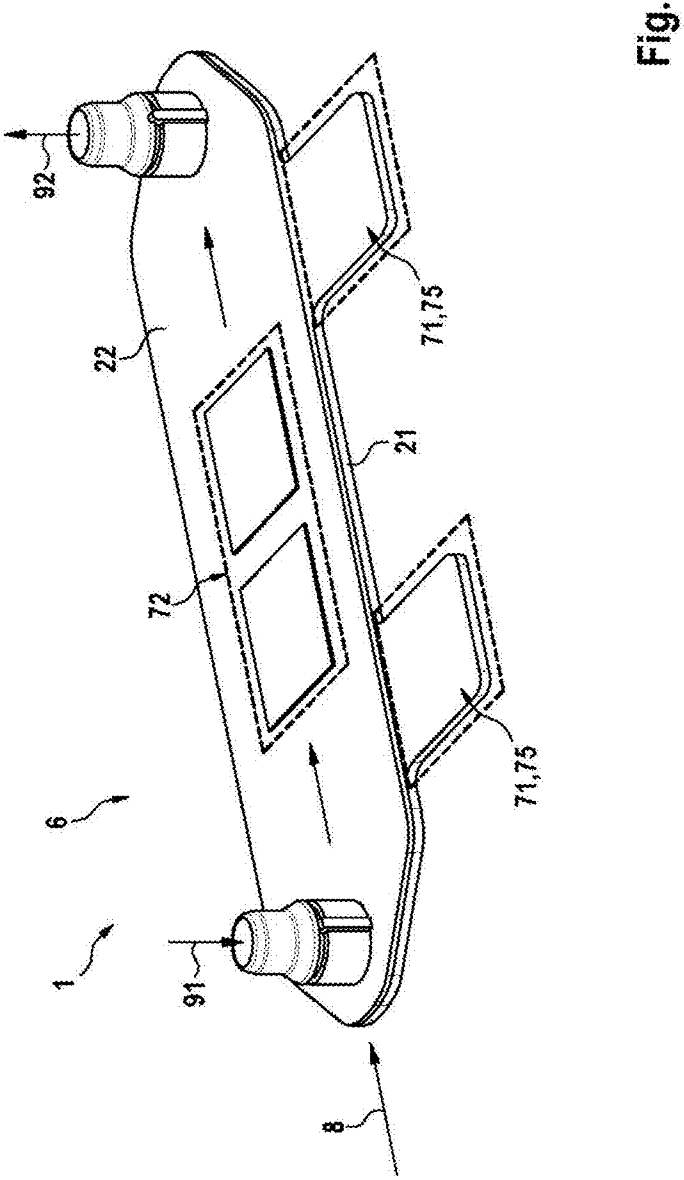
FIG. 1 an embodiment of a tempering device of a battery disconnect unit according to the invention, FIG. 2 the embodiment of the tempering device according to FIG. 1 in a sectional view from the side, and FIG. 3 an embodiment of a battery disconnect unit according to the invention in sectional view from the side.

FIG. 1 shows one embodiment of a tempering device 1 of a battery disconnect unit 10.

The tempering device 1 comprises a first tempering plate 21, on which a switching device 3 of the battery disconnect unit 10, which is not visible in FIG. 1, is arranged.

Furthermore, the tempering device 1 comprises a second tempering plate 22, on which the power electronics 4 of the battery disconnect unit 10, which are not visible in FIG. 1, are arranged.

The first tempering plate 21 and the second tempering plate 22 are connected to each other directly by a material-locking connection. Furthermore, the first tempering plate 21 and the second tempering plate 22 are connected in such a manner that a common flow chamber 5 is formed, which is not visible in FIG. 1.

The first tempering plate 21 and the second tempering plate 22 are formed from a metallic material, in particular aluminum.

Furthermore, the switching device 3 and the power electronics 4 can be arranged on a top side 6 of the tempering device 1.

Figure 2:
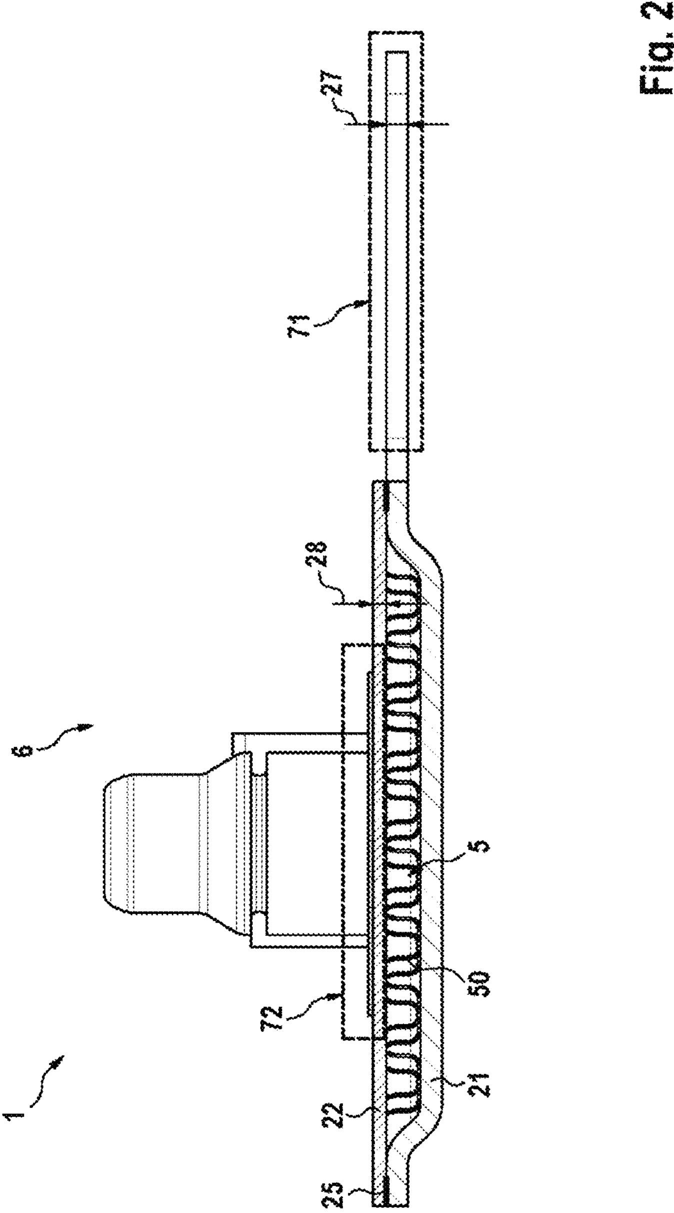

FIG. 2 shows the embodiment of the tempering device 1 according to FIG. 1 in a sectional view from the side.

Firstly, the first tempering plate 21 and the second tempering plate 22 are visible, which are directly connected to one other in a material-locking fashion to form a common flow chamber 5. In particular, such a material-locking connection 25 may be formed by soldering.

FIGS. 1 and 2 show that the first tempering plate 21 forms a first connection area 71, on which the switching device 3 can be arranged. Furthermore, FIGS. 1 and 2 show that the second tempering plate 22 forms a second connection area 72, on which the power electronics 4 can be arranged.

In particular, FIG. 2 shows that the second connection area 72 is arranged directly adjacent to the flow chamber 5.

FIG. 1 shows that the first connection area 71 forms two projections 75, on each of which a busbar 35 of the switching device 3 can be arranged.

Furthermore, FIG. 1 shows that the first connection area 71 and the second connection area 72 are arranged in a longitudinal direction 8 of the tempering device 1 offset from one another.

An internal insert 50 is also located in the flow chamber 5.

The tempering device 1 forms a first connection 91, which is configured to admit tempering fluid into the flow chamber 5. Furthermore, the tempering device 1 forms a second connection 92, which is configured to allow tempering fluid out of the flow chamber 5. The first connection 91 and the second connection 92 are arranged opposite one another in a longitudinal direction 8 of the tempering device 1.

Further, FIG. 2 shows that the first tempering plate 21 has a first thickness 27 and that the second tempering plate 22 has a second thickness 28.

The first thickness 27 is configured to be greater than the second thickness 28.

Figure 3:
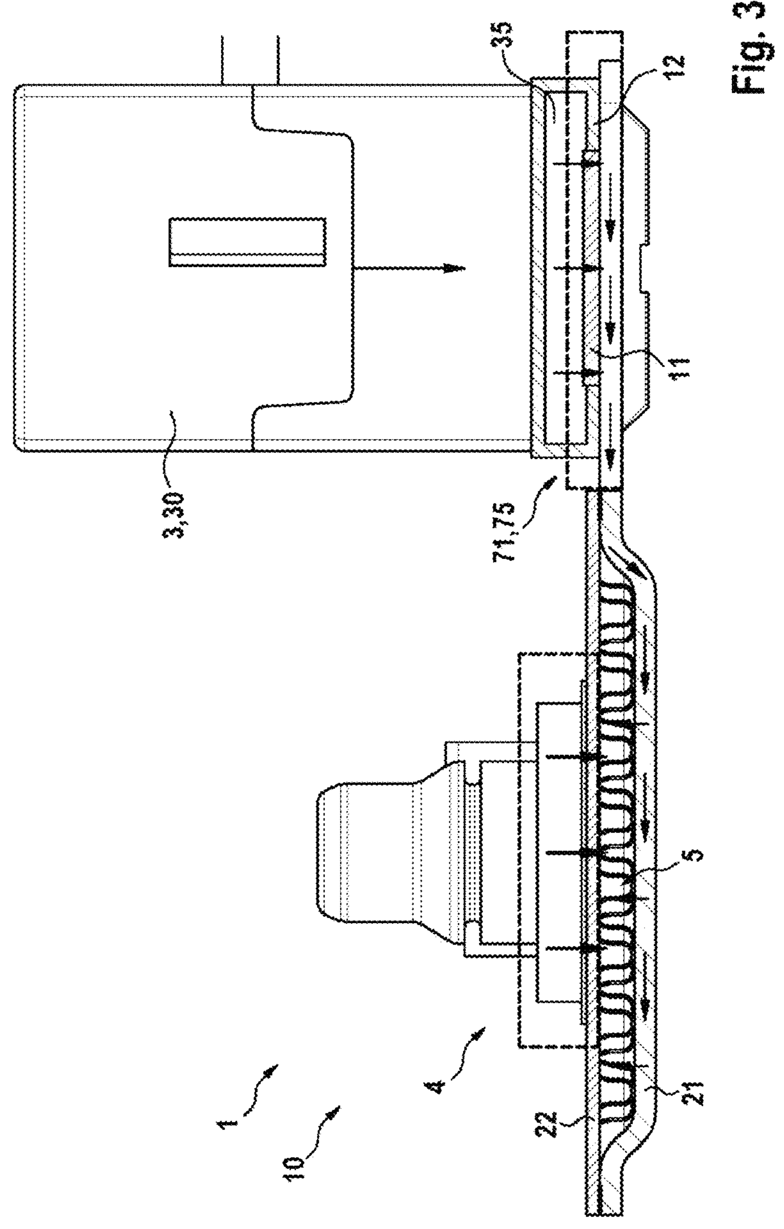

FIG. 3 shows a sectional view from the side of an embodiment of a battery disconnect unit 10 according to the invention.

The battery disconnect unit 10 comprises the tempering device 1 described in FIGS. 1 and 2, as well as a switching device 3, in particular a relay 30, and power electronics 4.

The switching device 3 is arranged in a thermally conductive manner on the first tempering plate 21, in particular the first connection area 71. In particular, a busbar 35 of the switching device 3 is arranged in a thermally conductive manner on a projection 75. For a better thermal connection, a thermal compensation material 11 can also be arranged between the busbar 35 and the projection 75. Further, an electrical insulation 12 can also additionally be arranged there.

The power electronics 4 are arranged in a thermally conductive manner on the second tempering plate 22, in particular the second connection area 72.

In addition, FIG. 3 illustrates the dissipation of heat from the switching device 3 along the first tempering plate 21 into the tempering fluid received in the flow chamber 5 and also the dissipation of heat from the power electronics 4 through the second tempering plate 22 into the tempering fluid received in the flow chamber 5.

The invention claimed is:

1. A tempering device of a battery disconnect unit (10) comprising:

a first tempering plate (21) on which a switching device (3) of the battery disconnect unit (10) can be arranged, and a second tempering plate (22) on which power electronics (4) of the battery disconnect unit (10) can be arranged, wherein the first tempering plate (21) and the second tempering plate (22) are directly connected to one another in a material-locking fashion forming a common flow chamber (5), wherein the switching device (3) and the power electronics (4) can be arranged on a top side (6) of the tempering device (1).

2. The tempering device according to claim 1, wherein the first tempering plate (21) comprises a first connection area (71) on which the switching device (3) can be arranged, and the second tempering plate (22) comprises a second connection area (72) on which the power electronics (4) can be arranged, wherein the second connection area (72) is arranged directly adjacent to the flow chamber (5).

3. The tempering device according to claim 2, wherein the first connection area (71) and the second connection area (72) are arranged in a longitudinal direction (8) of the tempering device (1) offset from each other.

4. The tempering device according to claim 2, wherein the first connection area (71) forms at least two projections (75), on each of which a power bus (35) of the switching device (3) can be arranged.

5. The tempering device according to claim 1, wherein the tempering device (1) forms a first connection (91), which is configured to allow tempering fluid into the flow chamber (5), and the tempering device (1) forms a second connection (92), which is configured to allow tempering fluid out of the flow chamber (5), wherein the first connection (91) and the second connection (92)

are arranged opposite one another in a longitudinal direction (8) of the tempering device (1).

6. The tempering device according to claim 1, wherein an internal insert (50) is included in the flow chamber (5).

7. The tempering device according to claim 1, wherein the first tempering plate (21) and the second tempering plate (22) are formed of a metallic material.

8. The tempering device according to claim 1, wherein the first tempering plate (21) has a first thickness (27), and the second tempering plate (22) has a second thickness (28), wherein the first thickness (27) is greater than the second thickness (28).

9. A battery disconnect unit with a tempering device according to claim 1, wherein a switching device (3) is arranged on the first tempering plate (21) in a thermally conductive manner, and the power electronics (4) are arranged on the second tempering plate (22) in a thermally conductive manner.

10. The tempering device according to claim 7, wherein the first tempering plate (21) and the second tempering plate (22) are formed of aluminum.

* * * * *